(12) United States Patent
Watanabe

(10) Patent No.: US 10,531,600 B2
(45) Date of Patent: Jan. 7, 2020

(54) COMPONENT DEPOSITING DEVICE

(71) Applicant: FUJI CORPORATION, Chiryu-shi (JP)

(72) Inventor: Masahiro Watanabe, Naka-gun (JP)

(73) Assignee: FUJI CORPORATION, Chiryu-shi (JP)

( * ) Notice: Subject to any disclaimer, the term of this patent is extended or adjusted under 35 U.S.C. 154(b) by 50 days.

(21) Appl. No.: 15/778,276

(22) PCT Filed: Dec. 7, 2015

(86) PCT No.: PCT/JP2015/084258
§ 371 (c)(1),
(2) Date: May 23, 2018

(87) PCT Pub. No.: WO2017/098551
PCT Pub. Date: Jun. 15, 2017

(65) Prior Publication Data
US 2018/0343776 A1    Nov. 29, 2018

(51) Int. Cl.
*H05K 13/02* (2006.01)
*H05K 13/04* (2006.01)
(Continued)

(52) U.S. Cl.
CPC ........... *H05K 13/021* (2013.01); *B65G 29/02* (2013.01); *B65G 47/1407* (2013.01);
(Continued)

(58) Field of Classification Search
CPC .... B65G 29/02; B65G 47/12; B65G 47/1407; B65G 47/18; B65G 47/19; B65G 47/848;
(Continued)

(56) References Cited

U.S. PATENT DOCUMENTS 9,327,911 B2 * 5/2016 Nozawa ............... H05K 13/028
9,351,434 B2 * 5/2016 Teraoka .............. H05K 13/028
(Continued)

FOREIGN PATENT DOCUMENTS

WO   WO 2014/045378 A1   3/2014
WO   WO-2014045378 A1 *  3/2014   ........... H05K 13/028

OTHER PUBLICATIONS

International Search Report dated Feb. 23, 2016 in PCT/JP2015/084258, filed Dec. 7, 2015.

*Primary Examiner* — Gene O Crawford
*Assistant Examiner* — Keith R Campbell
(74) *Attorney, Agent, or Firm* — Oblon, McClelland, Maier & Neustadt, L.L.P.

(57) ABSTRACT

A component depositing device in which components P stored inside storage container 140 in a bulk state are consecutively conveyed above depositing path 154 by rotating multiple magnets 142 in a first direction, the conveyed components are stopped by stopping wall 156 provided above the depositing path so as to fall onto the depositing path, thereby depositing a specified amount of the components into a case, wherein, when the specified amount of components has been deposited, the multiple magnets are stopped at a position such that the magnets currently pulling a component are not positioned above the depositing path. For example, the multiple magnets are stopped after being reverse rotated by a set angle. Because a magnet currently conveying a component is not above the depositing path when component depositing is completed, components are prevented from falling into the depositing path after component depositing is complete, thus preventing component blockages at the depositing path.

6 Claims, 6 Drawing Sheets

(51) Int. Cl.
*B65G 29/02* (2006.01)
*B65G 47/14* (2006.01)
*H05K 13/00* (2006.01)

(52) U.S. Cl.
CPC ....... *H05K 13/0084* (2013.01); *H05K 13/028* (2013.01); *H05K 13/0434* (2013.01)

(58) Field of Classification Search
CPC .. H05K 13/0084; H05K 13/02; H05K 13/021; H05K 13/028; H05K 13/0434
See application file for complete search history.

(56) References Cited

U.S. PATENT DOCUMENTS

| | | |
|---|---|---|
| 10,039,218 B2 * | 7/2018 | Kubota ................ H05K 13/028 |
| 10,080,320 B2 * | 9/2018 | Nozawa ............... H05K 13/028 |
| 2015/0237772 A1 | 8/2015 | Nozawa |

* cited by examiner

COMPONENT DEPOSITING DEVICE

TECHNICAL FIELD

The present application relates to a component depositing device for depositing a set amount of bulk components into a case.

BACKGROUND ART

An example of a known component depositing device for depositing bulk components into a case is disclosed in the patent literature below. With this device, a storage container for storing components in a bulk state is configured with a depositing path above which components are conveyed, the components falling onto the depositing path so as to be deposited into the case. The above component conveyance is performed using multiple magnets, which are arranged in a circle on the outside of the container, that pull the components, and a magnet rotating device that rotates the multiple magnets.

CITATION LIST

Patent Literature

Patent literature 1
WO2014/45378

BRIEF SUMMARY

Problem to be Solved

With the component depositing device disclosed in the above patent literature, there is a possibility that components being conveyed by being pulled by the magnets may fall onto the depositing path even after a specified amount of components has been deposited, and these fallen components may cause a blockage at the depositing path. The present disclosure takes account of such problems and an object thereof is to provide a component depositing device that reduces the risk of depositing path blockages after components have been deposited.

Means for Solving the Problem

To solve the above problems, a component depositing device of the present disclosure is for depositing a specified amount of bulk components into a case, the component depositing device including:

(a) a storage container configured to store the components in a bulk state;

(b) a depositing path integrated with the storage container, extending in a vertical direction, and configured to deposit the components into the case from a lower end of the depositing path;

(c) multiple magnets arranged in a circle at a specified angular pitch along a side wall on an outside of the storage container, each of the multiple magnets being configured to pull the components stored in the storage container towards the side wall; and (d) a magnet rotating device configured to rotate the multiple magnets, wherein a first example of the component depositing device is configured to rotate the multiple magnets around the circle using the magnet rotating device, such that the components stored in the storage container are conveyed by the multiple magnets above the depositing path along the side wall, the conveyed components are stopped by a stopping wall provided above the depositing path, and the stopped components fall onto the depositing path due to their own weight, and wherein the component depositing device of a first aspect of the disclosure is configured to, after a specified amount of components has been deposited into the case, stop the multiple magnets at a position at which, from the multiple magnets, one of the multiple magnets that is currently pulling the component is not positioned above the depositing path;

whereas a second example of the component depositing device is configured to, after a specified amount of components has been deposited into the case, stop the multiple magnets at a position at which, from the multiple magnets, the magnets currently pulling the component are not positioned above the depositing path.

With a component depositing device of the present disclosure, after the specified amount of components has been deposited, because there are no magnets that are pulling components above the depositing path, the possibility of a blockage occurring due to a component falling on the component depositing path is low.

DESCRIPTION OF EMBODIMENTS

Hereinafter, a representative embodiment of the present disclosure is described with reference to the drawings. Note that, in addition to the following embodiments, the present disclosure can be realized in various forms with changes or improvements implemented based on knowledge of someone skilled in the art.

Embodiments

Configuration of Component Mounter

Figure 1:
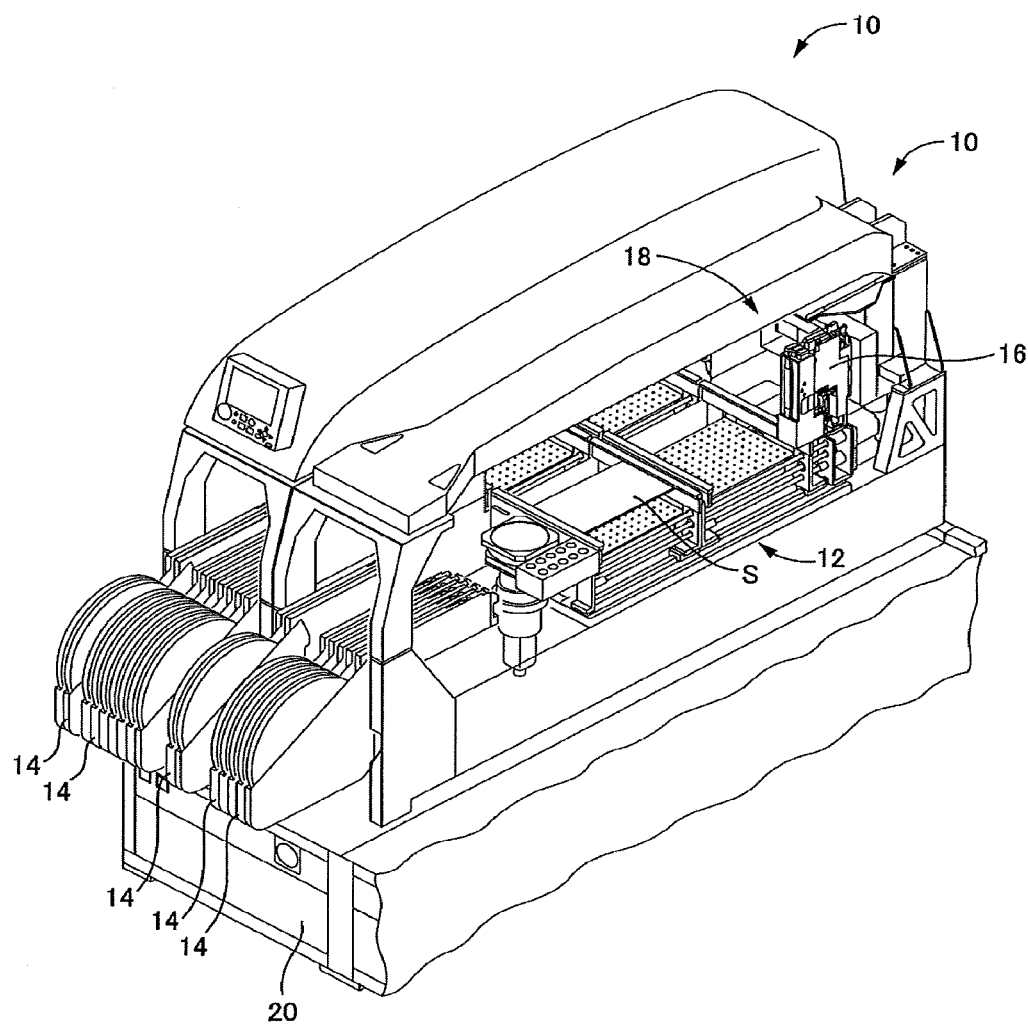
FIG. 1 is a perspective view of a component mounter provided with a component mounting head loaded with a component feeder having a case into which components are deposited using a component depositing device of an embodiment.

The case into which components are deposited using the component depositing device of the present disclosure is used in component mounter 10 shown in FIG. 1. Component mounter 10 is configured mainly from (a) board holding device 12 that holds a circuit board (also referred to as "board") S; (b) multiple component supply devices 14 that each supply electronic components (also referred to as "components"); (c) component mounting head 16 that picks up components supplied from each component supply device 14 and mounts the components on board S held by board holding device 12; and (d) mounting head moving device 18 that moves component mounting head 16 to and from board holding device 12 and component supply devices 14. Note that, in FIG. 1, two component mounters 10 are arranged lined up on base 20 (the front side component mounter 10 is shown with outer panels removed), and each component supply device 14 is shown in FIG. 1 as a tape feeder that supplies taped electronic components, that is, components held in tape arranged in a line, one by one.

Configuration of Component Mounting Head

Figure 2:
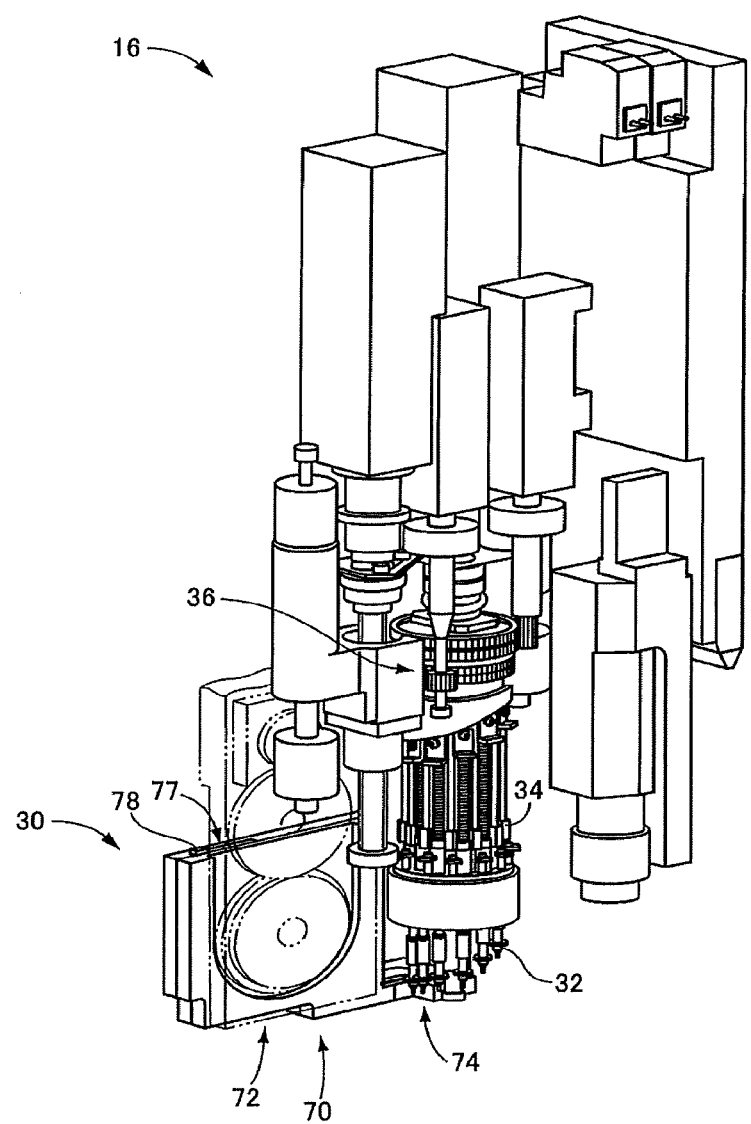
FIG. 2 is a perspective view showing the component mounting head provided on the component mounter of FIG. 1 with the outer covers removed.
Figure 3:
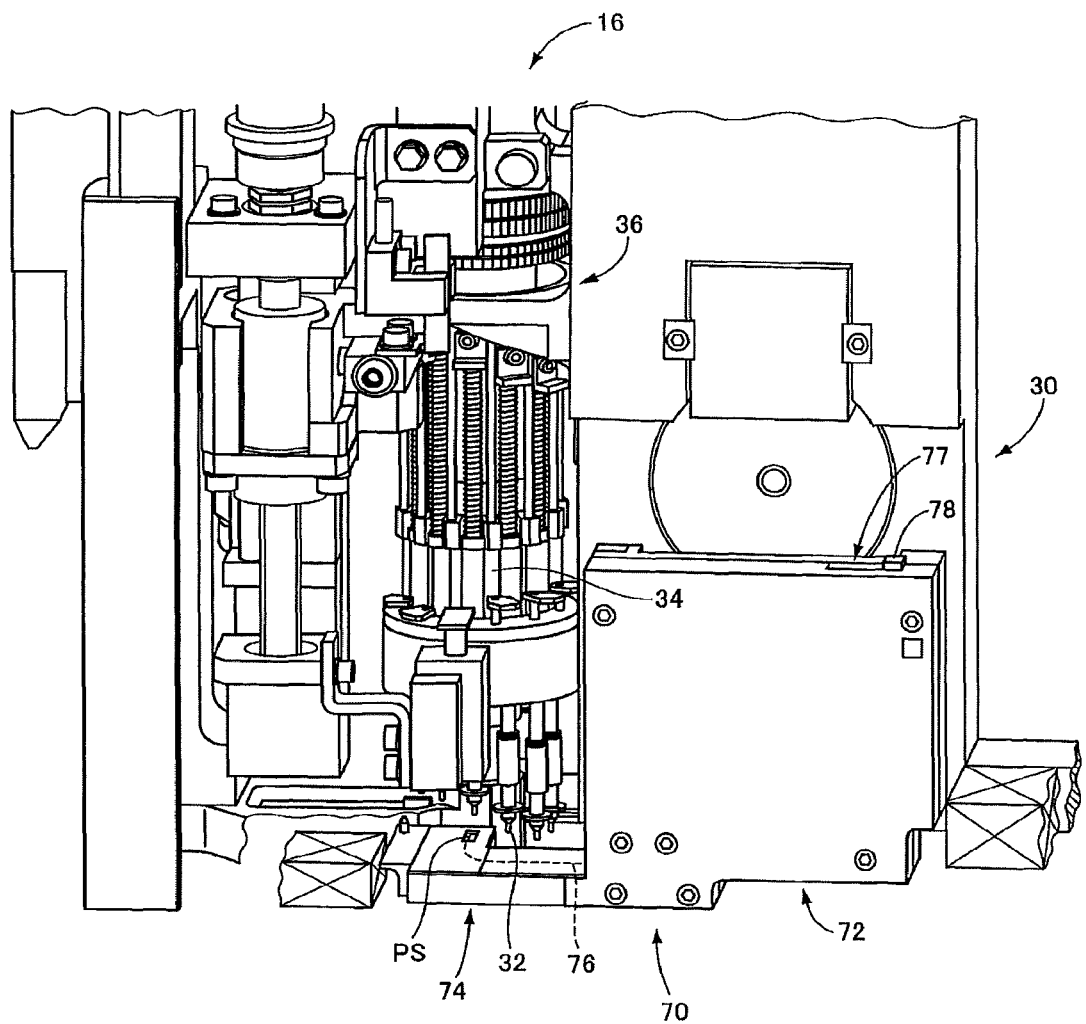
FIG. 3 is a perspective view showing the component mounting head of FIG. 2 from the opposite side.

As can be seen from FIGS. 2 and 3 showing component mounting head 16 with outer panels removed, component mounting head 16 is equipped with bulk component feeder (also referred to as "bulk feeder") 30 that supplies bulk components one by one to component supply position PS. In other words, mounting head 16 is a bulk-feeder-equipped component mounting head (a type of mounting head equipped with a component feeder). Note that, a bulk state refers to a state in which components are collected in a loose state.

Component mounting head 16 includes multiple (in this case, twelve) mounting units 34 attached to a bottom end of which are suction nozzles 32, the mounting units 34 being rod-shaped and arranged in a circle. Mounting units 34 are intermittently revolved all together by mounting unit moving device 36, and are configured to be raised and lowered when positioned at a component pickup position for picking up a component supplied from bulk feeder 30, and when positioned at a component mounting position for mounting the picked up component on a board.

Note that, component mounting head 16, when mounting a component supplied from a component supply device 14 mentioned above, is able to pick up a component supplied from the component supply device 14 using a mounting unit 34 positioned at the above component mounting position. Also, mounting units 34 pick up a component by negative pressure (pressure lower than atmospheric pressure) being supplied to suction nozzle 32, and mount the component on a board by positive pressure (pressure higher than atmospheric pressure) being supplied to suction nozzle 32.

Bulk Component Feeder

Bulk component feeder 30 includes case 70 that functions as a component storage container that stores components in a bulk state, and is removably attached to component mounting head 16. Case 70 includes case main body section 72 that stores components and protruding section 74 that protrudes sideways at a lower section of case main body section 72. Component supply position PS is provided on protruding section 74, and moving passage 76 for moving components in a specified orientation across case main body section 72 and protruding section 74 is formed extending up to component supply position PS. Components, after being guided from a component storage space of case main body section 72 to moving passage 76 by a moving mechanism, are moved through moving passage 76 so as to be supplied one by one at component supply position PS. Note that, moving passage 76 is a tunnel-shaped passage, the top of which is open at component supply position PS. Further, depositing opening 77 for depositing components into case main body section 72 is provided in an upper section of case main body section 72, with depositing opening 77 usually being covered with lid 78 that slides.

Component Depositing Device

Figure 4:
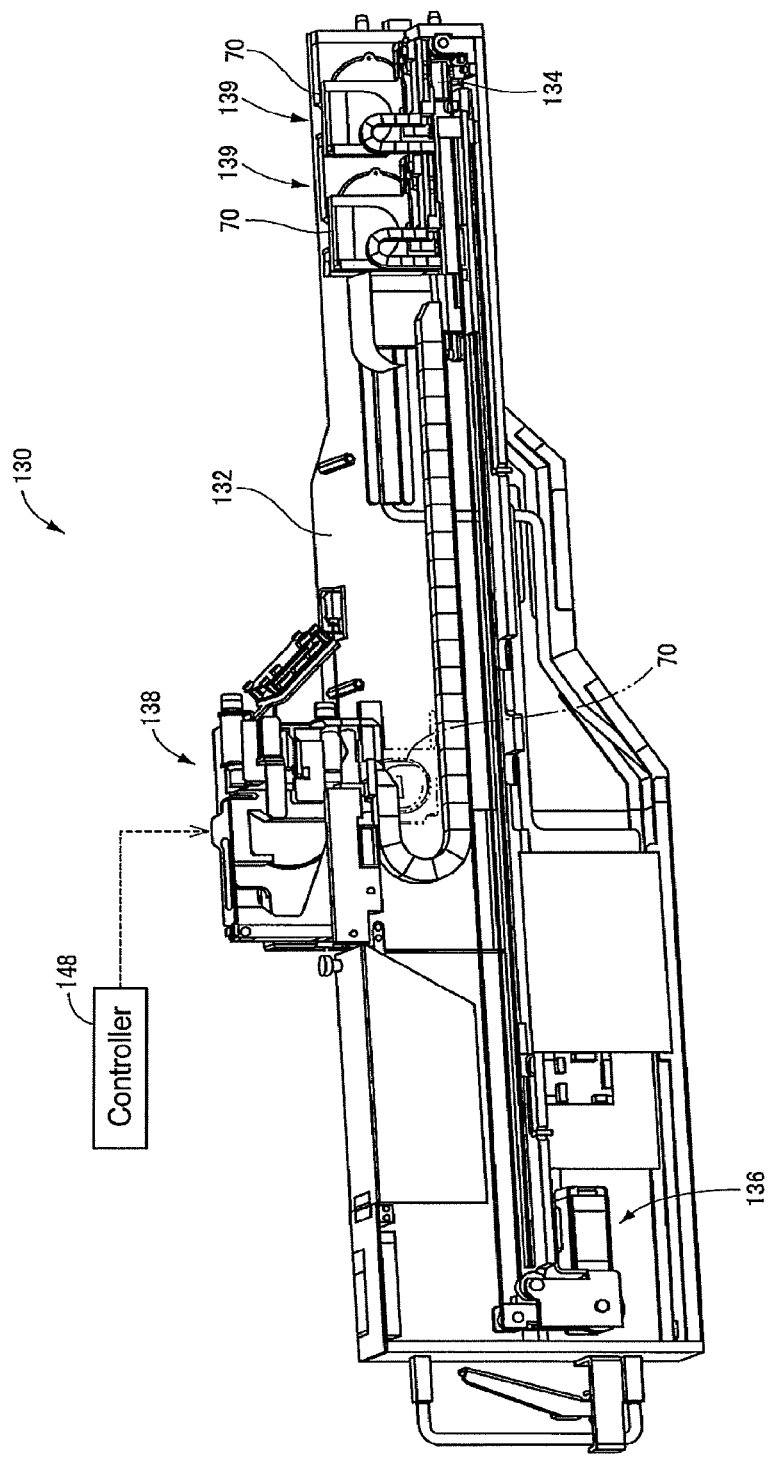
FIG. 4 is a perspective view showing the component depositing device of the embodiment.

Component depositing device 130 of the embodiment shown in FIG. 4 is for depositing components into case 70 of bulk feeder 30 on component mounting head 16. Component depositing device 130, in component mounter 10 shown in FIG. 1, is arranged instead of, or in addition to, component supply device 14. Case 70 is automatically removably attached to bulk feeder 30, and when components are deposited into case 70, component mounting head 16 is moved above an end section (the portion positioned on the right side in FIG. 4) in the lengthwise direction of the arranged component depositing device 130.

Component depositing device 130 is provided with: plate 132; carriage 134 that is supported on plate 132, loaded with case 70, and movable in the lengthwise direction; carriage moving device 136 that moves carriage 134 in the lengthwise direction; and component depositing section 138 provided on an upper section of an intermediate portion in the lengthwise direction.

Carriage 134 is provided with two loading sections 139 on each of which is loaded a case 70, and a lifter is provided on each of the loading sections 139. Using this lifter, case 70 is transferred between component depositing device 130 and bulk feeder 30 of component mounting head 16. In detail, a case 70 into which components have been deposited is attached to bulk feeder 30 of component mounting head 16, and a case 70 that has run out of components is collected at component depositing device 130. Depositing of components into a case 70 that ran out of components and was collected is performed in a state, as shown by the two-dashed line in the figure, with that case 70 moved below component depositing section 138 via carriage moving device. Note that, although not shown, component depositing section 138 is provided with a lid opening and closing device that opens and closes lid 78 of depositing opening 77 of case 70, and when depositing components into case 70, the lid is automatically opened by the lid opening and closing device.

Figure 5:
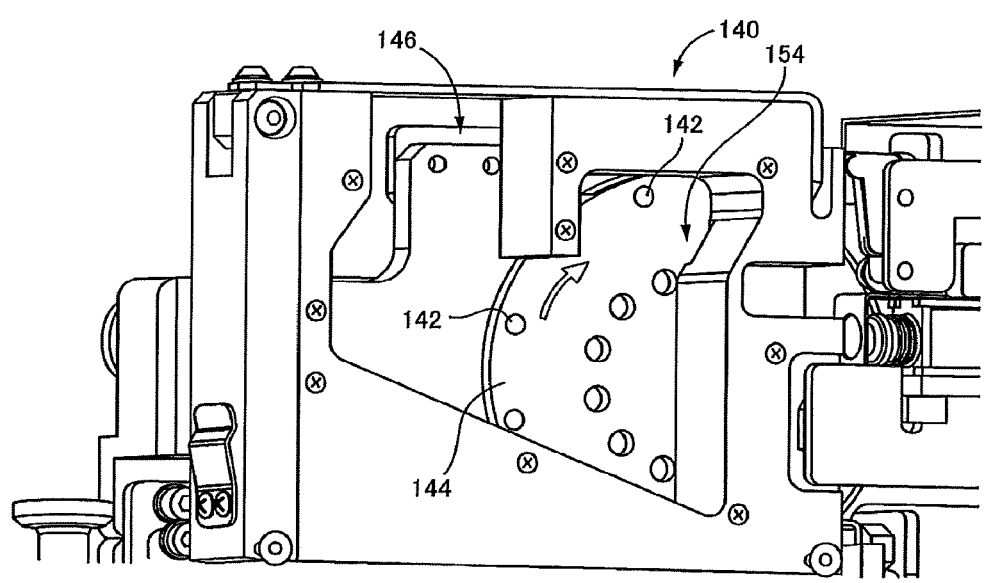
FIG. 5 is an enlarged perspective view of a component depositing section of the component depositing device of FIG. 4.

As shown in FIG. 5, storage container 140 that stores components in a bulk state is arranged in component depositing section 138. Although not clear from the figures, the side walls at the front side and rear side in FIG. 5 are formed from a relatively thin and transparent resin plate. Disc 144, on which multiple magnets 142, in this case, twelve magnets 142 are supported, is arranged on the outside of the side wall at the rear side of storage container 140. That is, multiple magnets 142 are arranged in a circle along the side wall separated by a set angular pitch. Disc 144 is rotated by rotating device 146, such that the multiple magnets 142 are revolved around the circle on which they are arranged. That is, rotating device 146 functions as a magnet rotating device. Rotating device 146 includes a stepping motor as a drive source, and control of the stepping motor is performed by controller 148, which is a control device based around a computer.

Figure 6:
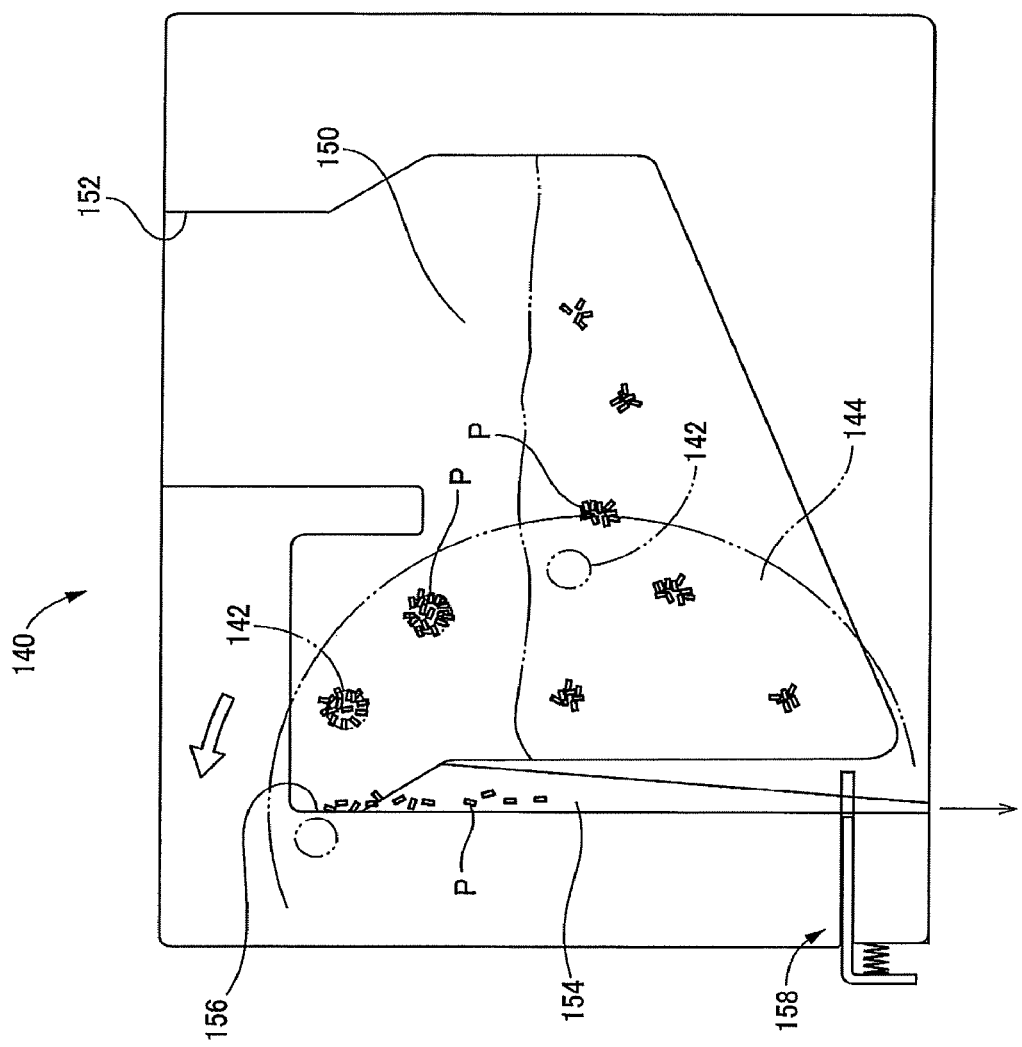
FIG. 6 shows a storage container provided on the component depositing section shown in FIG. 5 from the opposite side.

To describe storage container 140 as seen from the reverse side shown in FIG. 6, component storage space 150 with a sloping bottom is formed in storage container 140, and components P are supplied to component storage space 150 from supply opening 150 that is provided at an upper section, and are stored in a bulk state inside component storage space 150. That is, components are stored so as to gather in groups inside component storage space 150. In FIG. 6, disc 144 and multiple magnets 142 are arranged as shown by the two-dotted broken lines; disc 144 causes the multiple magnets 142 to revolve in a forward direction (direction of white arrow in FIGS. 5 and 6), by being rotated in a forward direction, that is, by forward rotation.

By rotating the multiple magnets 142 forwards, several components P pulled by each magnet 142 are lifted up from a component group and conveyed along the rear side wall. Depositing path 154 is integrated with component storage space 150 inside storage container 140 and extends in a vertical direction, and components P are moved above depositing path 154 by magnets 142. Stopping wall 156 is provided above depositing path 154 to demarcate a portion of component storage space 150, and conveyed components P are stopped by stopping wall 156, such that when the pulling by magnet 142 no longer has an effect, the component P falls due its own weight into depositing path 154. Case 70 is positioned such that depositing opening 77 faces the lower end of depositing path 154, and components P that follow into depositing path 154 are deposited into case 70 from the lower end of depositing path 154. Note that, shutter 158 is provided at a lower section of depositing path 154 to prevent components P being ejected at a time except when components P are being deposited in case 70.

Although not shown, a sensor for detecting the amount of stored components is provided in case 70, and when the sensor detects that there is a specified quantity of components P stored in case 70, controller 148 stops rotation of disc 144 so as to stop depositing of components P. Here, when there is a magnet in a state of conveying components P that have not yet reached stopping wall 15, even if shutter 158 is closed to prevent depositing to case 70, due to the effect of some force on component depositing device 130, the conveyed components P may drop into depositing path 154, and the dropped components P may cause a blockage at depositing path 154. In particular, if shutter 158 is closed, because components P accumulate on shutter 158, it is more likely that a blockage of depositing path 154 will occur. To prevent this, with component depositing device 130, by controlling rotating device 144, the multiple magnets 142 are stopped such that magnets 142 currently pulling components are not positioned above depositing path 154. Note that, the position of the magnets shown in FIG. 6 is an example of a position at which magnets 142 are not positioned above depositing path 154.

In detail, for example, the multiple magnets 142 may be stopped after being reverse-rotated by at least a set angle. In this case, it is desirable to stop the multiple magnets 142 after reverse-rotating by at least the set angular pitch. Accordingly, magnets currently conveying a component P can be reliably prevented from being positioned above depositing path 154 after depositing of components has been performed. Also, in this case, it is desirable to stop the multiple magnets 142 after having performed reverse-rotating until all the magnets 142 positioned above a component group are in a state not conveying components P. For example, as soon as component depositing is completed, if reverse-rotation is performed such that the magnet 142 positioned at the highest position goes past the side wall demarcating the bottom of component storage space 150, even for a case in which a minimum quantity of components P remains in component storage space 150, it is possible to create a state in which none of the magnets are conveying a component P.

Also, when multiple magnets 142 are stopped after having performed reverse-rotation by at least the set angular pitch, forward rotation and reverse rotation may then be repeated. By repeating forward and reverse rotation at a relatively high speed, it is possible to cause components being conveyed by magnet 142 above a component group to drop from the magnet onto the component group in component storage space 150. Further, it is also possible to cause components P being conveyed above a component group to drop onto the component group by stopping after having performed reverse-rotation by at least the set angular pitch at at least a speed at which the pulling of the components P being conveyed above the component group by the multiple magnets 142 is released, regardless of the final stopping position of the multiple magnets 142. By causing the components P to drop, it is possible to prevent blockages caused by components P falling into depositing path 154 after depositing of components is complete.

Reference Signs List

10: component mounter; 16: component mounting head; 30: bulk component feeder; 70: case (component storage container); 77: depositing opening; 130: component depositing device; 138: component depositing section; 140: storage container; 142: magnet; 144: disc; 146: rotating device (magnet rotating device); 148: controller; 150: component storage space; 152: supply opening; 154: depositing path; 156: stopping wall; 158: shutter; P: component

The invention claimed is:

1. A component depositing device for depositing a specified amount of bulk components into a case, the component depositing device comprising:
   (a) a storage container configured to store the components in a bulk state;
   (b) a depositing path integrated with the storage container, extending in a vertical direction, and configured to deposit the components into the case from a lower end of the depositing path;
   (c) multiple magnets arranged in a circle at a specified angular pitch along a side wall on an outside of the storage container, each of the multiple magnets being configured to pull the components stored in the storage container towards the side wall; and
   (d) a magnet rotating device configured to rotate the multiple magnets,
   wherein
   the component depositing device is configured to rotate the multiple magnets around the circle using the magnet rotating device, such that the components stored in the storage container are conveyed by the multiple magnets above the depositing path along the side wall, the conveyed components are stopped by a stopping wall provided above the depositing path, and the stopped components fall onto the depositing path due to their own weight, and after a specified amount of components has been deposited into the case, stop the multiple magnets after reverse-rotating the multiple magnets by the set angular pitch using the magnet rotating device.

2. The component depositing device according to claim 1, configured to, after the specified amount of the components has been deposited into the case, stop the multiple magnets after reverse-rotating the multiple magnets by at least the set angular pitch using the magnet rotating device.

3. The component depositing device according to claim 2, configured to, after the specified amount of the components has been deposited into the case, stop the multiple magnets after reverse-rotating the multiple magnets until reaching a state in which none of the multiple magnets are conveying the components.

4. The component depositing device according to claim 2, configured to, after the specified amount of the components has been deposited into the case, stop the multiple magnets after reverse-rotating the multiple magnets by at least the set angular pitch using the magnet rotating device, and after repeating the rotating and the reverse-rotating.

5. The component depositing device according to claim 1, configured to, after the specified amount of the components has been deposited into the case, stop the multiple magnets after reverse-rotating the multiple magnets by at least the set angular pitch using the magnet rotating device at at least a speed at which the pulling of the components being conveyed by the multiple magnets is released.

6. A component depositing device for depositing a specified amount of bulk components into a case, the component depositing device comprising:
   (a) a storage container configured to store the components in a bulk state;
   (b) a depositing path integrated with the storage container, extending in a vertical direction, and configured to deposit the components into the case from a lower end of the depositing path;
   (c) multiple magnets arranged in a circle at a specified angular pitch along a side wall on an outside of the storage container, each of the multiple magnets being configured to pull the components stored in the storage container towards the side wall; and
   (d) a magnet rotating device configured to rotate the multiple magnets,
wherein
the component depositing device is configured to rotate the multiple magnets around the circle using the magnet rotating device, such that the components stored in the storage container are conveyed by the multiple magnets above the depositing path along the side wall, the conveyed components are stopped by a stopping wall provided above the depositing path, and the stopped components fall onto the depositing path due to their own weight, and after a specified amount of components has been deposited into the case, stop the multiple magnets at a position at which, from the multiple magnets, the magnets that are currently pulling the component are not positioned above the depositing path.

* * * * *